(12) United States Patent
Eken et al.

(10) Patent No.: US 11,555,897 B2
(45) Date of Patent: Jan. 17, 2023

(54) TRANSIMPEDANCE AMPLIFIER WITH PULSE WIDENING

(71) Applicant: Analog Devices International Unlimited, Limerick (IE)

(72) Inventors: Yalcin Alper Eken, Istanbul (TR); Mehmet Arda Akkaya, Kemurburga (TR); Alp Oguz, Beyoglu (TR)

(73) Assignee: Analog Devices International Unlimited Company, Limerick (IE)

( * ) Notice: Subject to any disclaimer, the term of this patent is extended or adjusted under 35 U.S.C. 154(b) by 762 days.

(21) Appl. No.: 16/430,391

(22) Filed: Jun. 3, 2019

(65) Prior Publication Data

US 2020/0003875 A1 Jan. 2, 2020

Related U.S. Application Data

(60) Provisional application No. 62/693,000, filed on Jul. 2, 2018.

(51) Int. Cl.

| H03F 3/08 | (2006.01) |
|---|---|
| G01S 7/4861 | (2020.01) |
| H03F 1/08 | (2006.01) |
| G01S 17/10 | (2020.01) |
| H03F 1/34 | (2006.01) |

(52) U.S. Cl.
CPC ............ *G01S 7/4861* (2013.01); *G01S 17/10* (2013.01); *H03F 1/08* (2013.01); *H03F 1/34* (2013.01); *H03F 3/08* (2013.01); *H03F 2200/129* (2013.01); *H03F 2200/66* (2013.01)

(58) Field of Classification Search
CPC ....................................................... H03F 3/08

USPC ...................................... 330/308; 250/214 A
See application file for complete search history.

(56) References Cited

U.S. PATENT DOCUMENTS

| 5,123,732 A | 6/1992 | Gross et al. |
| 5,410,282 A | 4/1995 | Larrick et al. |
| 5,532,471 A | 7/1996 | Khorramabadi et al. |

(Continued)

OTHER PUBLICATIONS

Mikko Hintikka et al., *A CMOS Laser Radar Receiver for Sub-ns Optical Pulses*, 978-1-4799-8229-5/151 © 2015 IEEE, 4 pages.

(Continued)

*Primary Examiner* — Henry Choe
(74) *Attorney, Agent, or Firm* — Akona IP PC

(57) ABSTRACT

Mechanisms for evaluating amplitude for current pulses provided to a transimpedance amplifier (TIA) for current levels beyond the linear range of the TIA where clipping circuit(s) may limit the input voltage of the TIA are disclosed. In one aspect, an example TIA arrangement includes a clipping arrangement that includes multiple clipping circuits. Each clipping circuit can be biased by different bias voltages such that the different clipping circuits are activated at different input current amplitudes. Different clipping circuits can have different impedances, which can result in different recovery time characteristics. With the multiple clipping circuits in clipping arrangements discussed herein, a saturated dynamic range of a TIA can be divided into sub-regions and different pulse widening characteristics for each region may be defined, which may enable determination of amplitude for current pulses provided to the TIA even for current levels beyond the linear range of the TIA.

32 Claims, 7 Drawing Sheets

(56) References Cited

U.S. PATENT DOCUMENTS

| | | | |
|---|---|---|---|
| 5,793,230 | A | 8/1998 | Chu et al. |
| 6,404,281 | B1 | 6/2002 | Kobayashi |
| 6,816,009 | B2 | 11/2004 | Hughes et al. |
| 7,183,859 | B2 | 2/2007 | Visocchi et al. |
| 7,388,436 | B2 * | 6/2008 | Sutardja .............. H03F 1/08 330/311 |
| 9,325,426 | B2 | 4/2016 | Swoboda |
| 9,450,542 | B2 | 9/2016 | Mita et al. |
| 9,954,622 | B2 | 4/2018 | Sugimoto et al. |
| 9,966,907 | B1 | 5/2018 | Bafar et al. |
| 10,338,224 | B2 * | 7/2019 | Eken .................. H03F 1/08 |
| 2004/0016867 | A1 | 1/2004 | Milshtein et al. |
| 2007/0152136 | A1 | 7/2007 | Yao et al. |
| 2009/0135714 | A1 | 5/2009 | Deliwala |
| 2010/0283542 | A1 | 11/2010 | Shivaram et al. |
| 2012/0021712 | A1 | 1/2012 | Mikhemar et al. |
| 2014/0001341 | A1 | 1/2014 | Hassibi et al. |
| 2018/0275250 | A1 | 9/2018 | Adut |
| 2018/0275280 | A1 | 9/2018 | Eken et al. |
| 2018/0284272 | A1 | 10/2018 | Adut |

OTHER PUBLICATIONS

Sami Kurtti et al., *CMOS Receiver for a Pulsed TOF Laser Rangefinder Utilizing the Time Domain Walk Compensation Scheme*, 20$^{th}$ IMEKO TC4 International Symposium and 18$^{th}$ International Workshop on ADC Modelling and Testing Research on Electric and Electronic Measurement for the Electronic Upturn, Benevento, Italy, Sep. 15-17, 2014, 5 pages.

Thakur et al., *Efficient Design of 64:1 Hybridized MUX for Low Area and Power VLSI*, Int. Journal of Electrical & Electronics Engg., vol. 2, Issue 1 (2015), e-ISSN: 1694-2310 / p-ISSN: 1694-2426, 3 pages.

*Analog Switch and Multiplexer Applications*, Application Note, AN1034, Aug. 2002, Intersil®, 3 pages.

*Max3806, Receiver for Optical Distance Measurement*, Maxim Integrated, Rev. 1; Jun. 2014, 10 pages.

*Matrix APD Detector Arrays for LIDAR*, Silicon Sensor International AG, Pacific Silicon Sensor, Inc., press release dated Nov. 9, 2010, 2 pages.

Heinrichs et al., *Three-Dimensional Laser Radar with APD Arrays*, Proceedings vol. 4377, Laser Radar Technology and Applications VI; Sep. 19, 2001, 12 pages.

*Choosing the Correct Switch, Multiplexer, or Protection Product for Your Application*, © 2011 Analog Devices, Inc. www.analag.com/switch-mux, 8 pages.

Robinson et al., *64x64-Element Photocurrent Multiplexer for Infrared Staring Array Application*, IEEE Journal of Solid-State Circuits, vol. SC-22, No. 3, Jun. 1987, 0018-9200/87/0600-0453 © 1987 IEEE, 5 pages.

*First Sensor Application Note; APD Array with Guard Ring*, First Sensor, First Sensor AG, Pacific First Sensor, Inc., Ver. 08-07-11, 2 pages.

*ADS7952 Input Multiplexer / Photodiode / Transimpendanceamplifier*, Mar. 2, 2018, http://e2e.ti.com/support/data_converters/precision_data_converters/f/73/t/74981, 6 pages.

*Avalanche Photodiodes for LIDAR Applications*, First Sensor, Mar. 3, 2014, First Sensor, First Sensor AG, First Sensor, Inc., 2 pages.

*High-Speed, Low-Power, Single-Supply Multichannel, Video Multiplexer-Amplifiers*, Maxim, MAX4310-MAX4315, 19-1379; Rev. 3; 3/08, 18 pages.

*11.3 Gbps Optical Receiver*, ADN3010-11 Data Sheet, Analog Devices, © 2015-2016 Analog Devices, Inc., 11 pages.

Kurtti et al. *An Integrated Receiver Channel for a Laser Scanner*, IEEE Instrumentation and Measurement Technology Conference, May 2012, 5 pages.

*LTC6560 Single Channel Transimpedance Amplifier with Output Multiplexing*, DICE/DWF Specification, © 2019 Analog Devices, Inc. 4 pages.

*LTC6561 Four-Channel Multiplexed Transimpediance Amplifier with Output Multiplexing*, © 2018 Analog Devices, Inc., 24 pages.

*LTC6561 DICE/DWF, Four-Channel Multiplexed Transimpedance Amplifier with Output Multiplexing*, (c) 2019 Analog Devices, Inc. 4 pages.

Hamburger et al., *Transimpedance Amplifier with Fast Overload Recovery Target Lidar Automotive Markets*, Press Release, Nov. 20, 2018, Norwood, MA, 3 pages.

*Analog Switch and Multiplexer Applications*, Application Note, AN1034, Aug. 2002, Intersil®, 4 pages.

* cited by examiner

TRANSIMPEDANCE AMPLIFIER WITH PULSE WIDENING

CROSS-REFERENCE TO RELATED APPLICATIONS

This application claims the benefit of and priority from U.S. Provisional Patent Application Ser. No. 62/693,000 filed 2 Jul., 2018 entitled "TRANSIMPEDANCE AMPLIFIER WITH PULSE WIDENING", incorporated herein by reference in its entirety.

TECHNICAL FIELD OF THE DISCLOSURE

The present disclosure relates generally to electronics and, more specifically, to transimpedance amplifiers.

BACKGROUND

Light detection and ranging (LIDAR) systems are used in a variety of situations. For example, LIDAR systems can be used with airplanes, automobiles, binoculars or monoculars, etc. to detect a distance between a system and an object. LIDAR systems can transmit and/or receive laser light. A LIDAR system can include a receiver that includes an optoelectronic device, e.g., a photodetector (PD), and a transimpedance amplifier (TIA).

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

Figure 1:
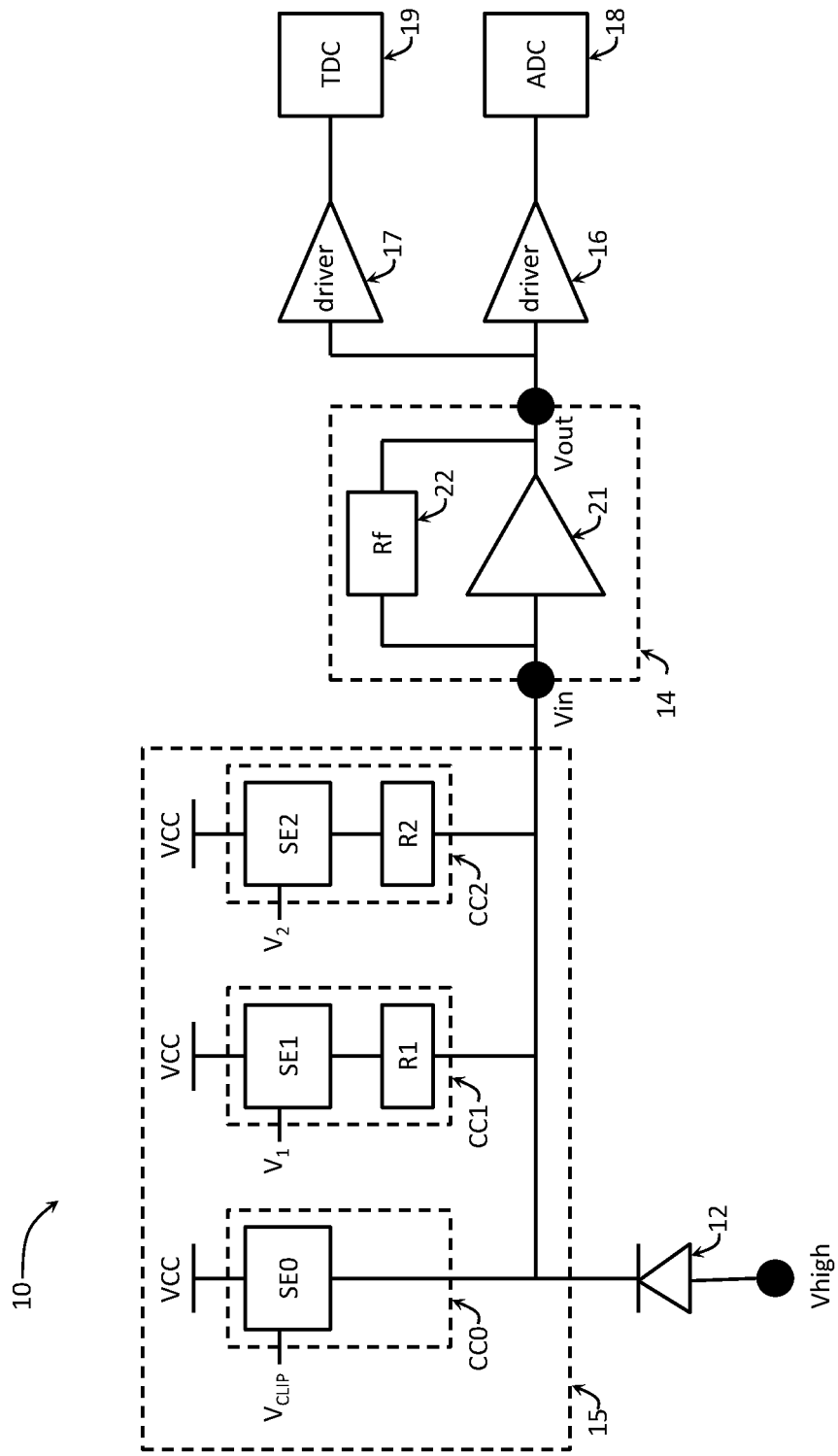
FIG. 1 is a schematic diagram of a receiver, e.g., a LIDAR receiver, with a clipping arrangement configured to control pulse widening according to one embodiment.

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

A LIDAR system can include a transmitter and a receiver. The transmitter can generate pulses of light and transmit the pulses of light to an object. The light can be laser light. The receiver can receive and process light reflected from the object. The receiver of the light detection and ranging system can include an optoelectronic device such as an avalanche photodiode (APD), a TIA, and an analog-to-digital converter (ADC). The receiver can also include one or more of an ADC driver, a programmable gain amplifier, or a filter such as a low pass filter.

In a variety of LIDAR applications, a receiver front-end includes an APD and a TIA having an input coupled to an output of the APD. A TIA architecture in LIDAR applications is a shunt-feedback amplifier architecture. In the shunt-feedback architecture, a resistor can be coupled between an input and an output of an amplification circuit of the TIA.

The APD can generate a current pulse proportional to the received optical power. In some implementations, the APD can be negatively biased with its cathode connected to a TIA. Accordingly, the APD can sink current from the TIA. The TIA can convert the current pulse into a voltage pulse. The TIA can provide a relatively high gain, which can facilitate detecting signals from relatively distant targets. For closer targets, the magnitude of the current pulse provided to the TIA can go beyond the linear input range of the TIA. In such cases, a shunt-feedback TIA is saturated and the shunt feedback that decreases the input impedance can be inactive. Consequently, the voltage at the TIA input can decrease to undesired levels as the input current to the TIA increases. For example, if the input current pulse drops, it may take time for an input voltage to the TIA to return its original value. This phenomenon can result in widening an output voltage pulse provided by the TIA, which can be referred to as "pulse-width distortion."

For relatively large input currents, the voltage at the input of the TIA can go to undesired levels. The voltage at the input of the TIA can be limited such that the TIA input transistor can operate properly and the TIA can produce meaningful outputs (e.g., the TIA operates as a limiting amplifier). The voltage at the input of the TIA can be limited such that a TIA input transistor is not damaged due to an excessive voltage difference across its terminals.

Various clipping circuits can be implemented to limit the input voltage to the TIA. For example, a diode can be used to clip the input of the TIA. A clipping voltage can be provided to a non-inverting terminal of an amplifier and an output of the amplifier can be connected to an inverting terminal of the amplifier. An anode of the diode can be connected to the output of the amplifier and a cathode of the diode can be connected to the input of the TIA. When the TIA operates in the linear region, the clipping diode can be off. When the TIA is saturated, the input voltage to the TIA decreases as the input current to the TIA increases, and the input voltage is clamped at the clipping voltage minus a diode voltage of the diode. When the clipping diode is on, pulse widening can be substantially constant and output pulses can be substantially the same for the range of input currents for which the clipping diode is on. The clipping voltage can be selected such that the TIA can properly operate in limiting mode and/or in a linear region. Another way to provide input clipping is to use a bipolar transistor. The clipping voltage can be provided to a base of the bipolar transistor and an emitter of the bipolar transistor can be electrically connected to the input of the TIA.

The APD current range can be from tens of nanoampere (nA) to hundreds of milliamperes (mA), for example. It is typically desirable to keep the amplitude information even at relatively high current levels, such as current levels that are beyond the linear range of the TIA and current levels where a clipping circuit limits the input voltage of the TIA. The amplitude information can be useful for object identification when combined with time information, as amplitude can be dependent on the object reflectivity. For example, a metal car is typically more reflective than a tree.

Amplitude information on a received optical pulse can be lost when the input current is larger than the linear region of the TIA (e.g., in a range from about 10 nA to about 100 microamperes (uA)). For example, an input node voltage for a TIA can be hard clipped by a clipping diode. In such circumstances, there can be no significant differentiation of recovery times after pulses. A pulse widening amount associated with hard clipping by a clipping diode can be saturated for high amplitude current pulses. Embodiments of the present disclosure provide technical solutions to maintain the amplitude information even in the saturated region of the TIA.

Some aspects of the present disclosure relate to a clipping circuit arrangement configured to control pulse width of an output voltage of the TIA for input currents that are outside of the linear range of the TIA. Amplitude information of the input currents that are outside of the linear range of the TIA can be extracted from the widened pulse. A clipping arrangement can include multiple clipping current paths or branches, referred to herein as different clipping circuits. Each clipping current path/circuit can be biased by different bias voltages such that the different clipping current paths/circuits are activated at different input current amplitudes. For instance, a switching element (e.g., a bipolar transistor, a field-effect transistor, or a diode) of each clipping current path/circuit can receive a different bias voltage to activate the respective current clipping path at different amplitudes of the input current for a TIA. Different clipping current paths/circuits can include resistors having different respective resistances or, more generally, different clipping current paths/circuits can have different impedances, which can result in different recovery time characteristics. With the multiple clipping current paths/circuits in clipping arrangements discussed herein, a saturated dynamic range of a TIA can be divided into sub-regions and different pulse widening characteristics for each region may be defined, which may enable determination of amplitude information for current pulses provided to an input port of a TIA even for current levels beyond the linear range of the TIA. As used herein, pulse widening can refer to an increase in pulse width with respect to a received optical pulse width.

To summarize, embodiments of the present disclosure provide mechanisms for evaluating amplitude information for current pulses provided to an input port of a TIA even for current levels beyond the linear range of the TIA where a clipping circuit may limit the input voltage of the TIA. In one aspect, a TIA arrangement includes a TIA and a clipping arrangement that includes at least a first and a second clipping circuits, e.g., clipping circuits CC1 and CC2, described herein, each of which is coupled to an input port/node of the TIA and configured to clip an input voltage of the TIA, and where an impedance of the second clipping circuit is larger than an impedance of the first clipping circuit. For the embodiments where the TIA arrangement is used in a receiver that includes a PD configured to sink current from the TIA (e.g., a negatively biased APD with its cathode connected to the TIA), a bias voltage of the second clipping circuit is higher than a bias voltage of the first clipping circuit. For the embodiments where the TIA arrangement is used in a receiver that includes a PD configured to source current to the TIA (e.g., when an anode of the PD is coupled to the TIA input, e.g. with the cathode of the PD being exposed to a large voltage, e.g., to a voltage of 100-200 volts), a bias voltage of the second clipping circuit is lower than a bias voltage of the first clipping circuit. Such a clipping arrangement may ensure that different clipping circuits are activated (i.e., start clipping the input voltage of the TIA) under different conditions (e.g., for different input currents), which may, effectively, make the curve of the pulse width of the output voltages of the TIA versus input current magnitudes less flat in regions where current amplitudes are beyond the linear range of TIA operation. As a result, a processor (e.g., a hardware processor) may then be configured to determine/estimate the amplitude information of the input currents to the TIA based on the pulse width of the output voltages produced by the TIA even for the input currents that are outside of the linear range of the TIA. In this manner, a range of TIA input currents from which meaningful information can be extracted may be extended. When used in a LIDAR system, the processor may also be configured to derive a measure of a distance to an object based on the determined amplitude of the TIA input current.

Other aspects of the present disclosure provide systems, e.g. LIDAR systems or any receiver systems, which include such TIA arrangements, as well as methods for operating such arrangements and systems, and methods for determining distance to at least one object based on the output voltages generated by the TIA.

As will be appreciated by one skilled in the art, aspects of the present disclosure, in particular aspects of TIA arrangements with multiple clipping circuits configured to activate under different conditions as proposed herein, may be embodied in various manners—e.g. as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Functions described in this disclosure may be implemented as an algorithm executed by one or more hardware processing units, e.g. one or more microprocessors, of one or more computers. In various embodiments, different steps and portions of the steps of each of the methods described herein may be performed by different processing units. Furthermore, aspects of the present disclosure may take the form of a computer program product embodied in one or more computer readable medium(s), preferably non-transitory, having computer readable program code embodied, e.g., stored, thereon. In various embodiments, such a computer program may, for example, be downloaded (updated) to the existing devices and systems (e.g. to the existing receivers, LIDAR systems, and/or their controllers, etc.) or be stored upon manufacturing of these devices and systems.

The following detailed description presents various descriptions of specific certain embodiments. However, the innovations described herein can be embodied in a multitude of different ways, for example, as defined and covered by the claims or select examples. In the following description, reference is made to the drawings where like reference numerals can indicate identical or functionally similar elements. It will be understood that elements illustrated in the drawings are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Other features and advantages of the disclosure will be apparent from the following description and the claims.

Example Receiver with a TIA Arrangement with Multiple Clipping Circuits

FIG. 1 is a schematic diagram of a LIDAR receiver 10 according to an embodiment. As illustrated, the LIDAR 10 receiver may include an optoelectronic device 12 (e.g., an APD), a TIA 14, a clipping arrangement 15, drivers 16 and 17, an ADC 18, and a time-to-digital converter (TDC) 19. As described herein, the clipping arrangement 15 may be configured to control pulse widening for input currents to the TIA 14 that are outside of the linear range of the TIA 14, which may, advantageously, provide amplitude information for input currents associated with the saturation region of the TIA 14.

The optoelectronic device 12 may be configured to receive a pulse of light reflected from an object and to convert the pulse of light to a current pulse. The optoelectronic device 12 may be a photodiode, such as the illustrated APD. As illustrated in FIG. 1, in some embodiments, the APD may have its cathode connected to the input port of the TIA 14 (the input port of the TIA 14 is illustrated in FIG. 1 with a black dot labeled with "Vin"). Accordingly, the APD is negatively biased and can sink current from the TIA 14. The optoelectronic device 12 may be external to an integrated circuit that includes a TIA arrangement in the form of the TIA 14 and the clipping arrangement 15. In some other applications, an integrated circuit can include the optoelectronic device 12, the TIA 14, and the clipping arrangement 15.

The TIA 14 may be configured to amplify the current pulse from the optoelectronic device 12 and provide a voltage pulse. The illustrated TIA 14 is a shunt-feedback TIA. The illustrated TIA 14 may include an amplification circuit 21 and a feedback resistor (Rf) 22 electrically coupled between an input of the TIA 14 and an output of the TIA 14 (the output port of the TIA 14 is illustrated in FIG. 1 with a black dot labeled with "Vout"). The feedback resistor 22 may have a resistance Rf. In some embodiments, the resistance Rf can be in a range from about 5 kiloohm (kΩ) to about 80 kΩ, for example. The output of the TIA 14 may be electrically connected to an input of an ADC driver 16. The ADC driver 16 may be configured to drive the ADC 18. The ADC 18 may convert the received pulse to a digital signal. The digital signal can be provided to a digital signal processor (not shown in FIG. 1). The output of the TIA 14 may be electrically connected to an input of a TDC driver 17. The TDC driver 17 may be configured to drive the TDC 19. The TDC 19 may convert the received pulse to a digital signal representative of time stamps of edges of the pulse. The digital signal can be provided to a digital signal processor.

In FIG. 1, the LIDAR receiver 10 includes the clipping arrangement 15 arranged to route extra current from the APD during a clipping event to a supply. The clipping event can also be referred to as an overload event. The extra current can be additional APD current after TIA 14 is saturated. The extra current can be referred to as a clipping current $I_{CLIP}$. For a TIA 14 with a 100 microamperes (uA) linear region, the clipping current $I_{CLIP}$, can be equal to about the current $I_{APD}$ from the APD minus 100 uA. In some embodiments, one or more bipolar transistors may be used within the clipping arrangement 15. A bipolar transistor can be beneficial for clipping due to its' exponential characteristic. The clipping bipolar transistors can be relatively small devices and clip relatively large currents.

The clipping arrangement 15 is configured to clip an input voltage of the TIA 14 and control widening of the output voltage pulse provided by the TIA 14. In particular, the clipping arrangement 15 may include a plurality of clipping circuits, shown in the illustrative example of FIG. 1 as 3 clipping circuits, CC0, CC1, and CC2, configured to be activated at different times (e.g., when different currents are applied to the input of the TIA 14). The illustrated clipping arrangement 15 includes switching elements SE0, SE1, and SE2 and resistors having resistances R1 and R2. Thus, as shown in FIG. 1, the clipping circuit CC0 may include the switching element SE0, the clipping circuit CC1 may include the switching element SE1 and the resistor R1, and the clipping circuit CC2 may include the switching element SE2 and the resistor R2. The resistor R1 may be coupled between the switching element SE1 and the input of the TIA 14, and the resistor R2 may be coupled between the switching element SE2 and the input of the TIA 14.

As shown in FIG. 1, the clipping circuit CC0 can be bias at a hard clipping voltage $V_{clip}$ and can route the extra current (additional APD current after the TIA 14 is saturated) from the APD to the supply during a clipping event. The SE0 of the CC0 may be implemented as a clipping transistor such as a bipolar transistor, for example. As further shown in FIG. 1, instead of using only one large clipping transistor biased at a hard clipping voltage $V_{CLIP}$, additional clipping paths with different clipping characteristics are also included in the clipping arrangement 15. Namely, additional clipping paths include the clipping circuits CC1 and CC2, shown in FIG. 1. Descriptions of the clipping arrangement 15 may be extended to any other number of two or more clipping circuits (e.g., only CC0 and CC1 as shown in FIG. 1 but without CC2, or, in another example, CC0, CC1, and CC2 as shown in FIG. 1 and one or more additional clipping circuits CC3, etc.), all of which being within the scope of the present disclosure.

In some embodiments, the switching elements SE0, SE1, and SE2 may be implemented as bipolar transistors Q0, Q1, and Q2, respectively. In other embodiments, the switching elements SE0, SE1, and SE2 may be implemented as field-effect transistors. In still other embodiments, the switching elements SE0, SE1, and SE2 may be implemented as diodes, e.g., as Schottky diodes or p-n junction diodes. Further, in some embodiments, the switching elements SE0, SE1, and SE2 may be implemented as any combination of bipolar transistors, field-effect transistors, and diodes (e.g., one of the switching elements may be implemented as a bipolar transistor while another may be implemented as a field-effect transistor or a diode, etc.).

Consider the example of the switching elements SE0, SE1, and SE2 being implemented as bipolar transistors Q0, Q1, and Q2, respectively. The illustrated clipping arrangement 15 includes three clipping current paths, a first clipping current path that includes bipolar transistor Q0, a second clipping current path that includes bipolar transistor Q1 and a resistor with resistance R1, and a third clipping current path that includes bipolar transistor Q2 and a resistor with resistance R2. The bipolar transistor Q0 may have a base that is biased at a hard clipping voltage $V_{CLIP}$ to set a voltage at which the bipolar transistor Q0 implements hard clipping. The bipolar transistor Q1 may have a base that is biased at a first voltage $V_1$. The bipolar transistor Q1 may have a degeneration resistor with a resistance R1 connected to its emitter. The bipolar transistor Q2 may have a base that is biased at a second voltage $V_2$. The bipolar transistor Q2 may have a degeneration resistor with a resistance R2 connected to its emitter. In the embodiments where the optoelectronic device 12 is configured to sink current from the TIA 14, the bias voltages for the clipping bipolar transistors can be configured such that the second voltage $V_2$ is greater than the first voltage $V_1$, and the first voltage $V_1$ is greater than the hard clipping voltage $V_{CLIP}$. For example, in some embodiments, the bias voltage $V_2$ may be at least 100 mV higher than the bias voltage $V_1$, e.g., at least 200 mV higher, at least 500 mV higher, or at least 700 mV higher. Similarly, in some embodiments, the bias voltage $V_1$ may be at least 100 mV higher than the bias voltage $V_{CLIP}$, e.g., at least 200 mV higher, at least 500 mV higher, or at least 700 mV higher (in general, the difference between the bias voltages $V_2$ and $V_1$ may be different from the difference between the bias voltages $V_1$ and $V_{CLIP}$). A voltage level of clipping of a given clipping circuit may be based on (e.g., may be at least partially defined by) the bias voltage of the clipping circuit. Therefore, having multiple clipping circuits with different bias voltages may ensure that different clipping circuits turn on at different times, depending on the voltage Vin at the input of the TIA 14. In some embodiments, the bias voltage of the clipping circuit configured to turn on first (i.e., the bias voltage $V_2$ of CC2) may be higher than a voltage at the input of the TIA 14 if an input current applied to the input of the TIA 14 is greater, e.g. equal to or greater, than the maximum current for which the TIA 14 is operable in a linear mode.

In some embodiments, the clipping arrangement 15 may be such that any one of the clipping voltage $V_{CLIP}$, the first voltage $V_1$, and/or the second voltage $V_2$ can be adjustable. Adjusting the bias voltage of the switching elements of different clipping circuits may advantageously adjust the point at which the switching element (e.g., a bipolar transistor) of a clipping path turns on (or, in other words, adjust the time at which the clipping circuit containing said switching element is activated to start clipping).

The resistances of the illustrated resistors can be configured such that the resistance of the feedback resistor $R_F$ is greater than the resistance of the resistor R2, and the resistance of the resistor R2 is greater than the resistance of the resistor R1. In some embodiments, the resistances R1 and R2 can be relatively low impedances compared to the resistance $R_F$ of the feedback resistor of the TIA 14. In general, clipping circuits CC0, CC1, and CC2 may be described with reference to their impedance instead of just resistance. For example, in some embodiments, the impedance of the clipping circuit CC2 may be at least 50% larger than the impedance of the clipping circuit CC1, e.g., at least 100% larger, at least 200% larger, or at least 500% larger. Similarly, in some embodiments, the impedance of the clipping circuit CC1 may be at least 50% larger than the impedance of the clipping circuit CC0, e.g., at least 100% larger, at least 200% larger, or at least 500% larger (in general, the difference between the impedances of the clipping circuits CC2 and CC1 may be different from the difference between the impedances of the clipping circuits CC1 and CC0). Having multiple clipping circuits with different impedances allows extending the range of input currents (i.e., currents applied to the input of the TIA 14) outside of the linear mode of the TIA for which evaluation of a pulse width of voltage pulses at the output of the TIA still allows estimation of the magnitude of the input currents input to the TIA In some embodiments, the resistor of the second clipping current path and/or the resistor of the third clipping path can have an adjustable resistance (i.e., R1 and/or R2 may be adjustable).

As the input current to the TIA 14 is increased, the TIA 14 begins to saturate when the input current gets to a sufficiently high current level. With reference to the clipping arrangement 15 of FIG. 1, then the third clipping current path (i.e., the clipping circuit CC2) is activated, followed by the second clipping current path (i.e., the clipping circuit CC1) being activated, and then followed by the first clipping current path (i.e., the clipping circuit CC0) being activated as the input current increases further. Thus, phrased differently, the first clipping circuit CC0 may be configured to turn on and clamp an input voltage of the TIA 14 when an input current to the TIA 14 is greater than a certain first threshold current $1_1$, the second clipping circuit CC1 may be configured to turn on and clamp an input voltage of the TIA 14 when an input current to the TIA 14 is greater than a certain second threshold current $1_2$, and the third clipping circuit CC2 may be configured to turn on and clamp an input voltage of the TIA 14 when an input current to the TIA 14 is greater than a certain third threshold current $1_3$, where the threshold current $1_3$ is the smallest and the threshold current $1_1$ is the largest (with the threshold current $1_2$ being in between the threshold currents $1_3$ and $1_1$). In some embodiments, the first threshold current $1_1$ may be at least 50% larger than the second threshold current $1_2$, e.g., at least 100% larger, at least 200% larger, or at least 500% larger. Similarly, in some embodiments, the second threshold current $1_2$ may be at least 50% larger than the third threshold current $1_3$, e.g., at least 100% larger, at least 200% larger, or at least 500% larger, where, in general, the difference between the threshold currents $1_1$ and $1_2$ may be different from the difference between the threshold currents $1_2$ and $1_3$. At least the threshold currents $1_2$ and $1_3$, or, in some embodiments, each of the threshold currents $1_1$, $1_2$ and $1_3$ may be outside of the range of (i.e., higher in magnitude than) currents for which the TIA 14 is operable in the linear mode. Thus, the TIA 14 is configured to generate voltage pulses when input currents are applied to the input of the TIA 14, and the different clipping circuits of the clipping arrangement 15 are configured to control the pulse width of the voltage pulses in different respective ranges of amplitude of the input currents to the TIA 14, the different respective ranges of amplitude of the input currents to the TIA 14 being outside of a range of the input currents for which the TIA 14 is operable in a linear mode.

For relatively low level input currents for the saturation range of the TIA 14, only the switching element SE2 (e.g., bipolar transistor Q2) of the clipping arrangement 15 is activated and pulse widening behavior is determined by third clipping current path that includes the switching element SE2 and the resistor with resistance with R2. In such circumstances, pulse widening can be determined by the switching element SE2 and the resistor with resistance R2 only (where the current value at point 33 may correspond to the third threshold current $1_3$, described above). This corresponds to the Q2 dominated region of the graph of FIG. 3. For higher input currents, both of the switching elements SE1 and SE2 (e.g., both bipolar transistors Q1 and Q2) may be activated and pulse widening can be determined by both of the switching element SE1 and SE2 and the resistors having resistances R1 and R2. In this case, pulse widening behavior can primarily be determined by the second clipping current path that includes the switching element SE1 and the resistor with resistance R1. This corresponds to the Q1 dominated region of the graph of FIG. 3 (where the current value at a line 32 may correspond to the second threshold current $1_2$, described above). For even higher input currents, all three clipping current paths shown in FIG. 1 can be activated, i.e., all three of the switching elements SE0, SE1, and SE2 (e.g., both bipolar transistors Q0, Q1 and Q2) may be activated and pulse widening can be determined by the switching elements SE0, SE1, and SE2 and the resistors having resistances R1 and R2. In this case, pulse widening behavior can be primarily determined by the bipolar transistor Q0. This corresponds to the Q0 dominated region of the graph of FIG. 3 (where the current value at a line 31 may correspond to the first threshold current $I_1$, described above).

As an example, if bipolar transistor Q0 triggers for relatively large current levels, Q0 initially pulls up the input voltage to the TIA 14. When the input voltage for the TIA 14 is high enough to turn off the bipolar transistor Q0, then the second clipping current path that includes bipolar transistor Q1 and the resistor with resistance R1 keeping pulling up. When the input voltage for the TIA 14 is high enough to turn the bipolar transistor Q1 off, the third clipping current path that includes bipolar transistor Q2 and the resistor with resistance R2 keeps pulling up. Finally, in this example, when the bipolar transistor Q2 is turned off, then the feedback resistor 22 of the TIA 14 pulls up the input voltage of the TIA 14.

By changing the number of clipping current paths and/or bias voltages and/or resistances of current paths, the saturation region of the TIA 14 can be divided into sub-regions and define a different pulse widening characteristic for each sub-region. When a given clipping path is activated, it changes impedance (e.g., resistors R1 and R2 shown in FIG. 1 define different impedances) and the pulse widening is dependent on the impedance. Namely, the higher the impedance, the greater is the pulse widening. The first clipping circuit CC0 (the one to be activated last) has no or very low impedance (hence, no resistor is shown to be included in CC0, although a small resistance R0 may be included, R0<R1) and, therefore, is associated with no or relatively small pulse widening. The last clipping circuit CC2 (the one to be activated first, for the example shown in FIG. 1), has the highest impedance and, therefore, is associated with the largest pulse widening. The second clipping circuit CC1 (the one to be activated second, after CC2 and before CC0, for the example shown in FIG. 1), has the next highest impedance after CC2 and, therefore, is associated with the second largest pulse widening.

Amplitude of the input current can be extracted by using pulse widening information. There can be a one-to-one mapping between pulse widening and input current level for such extraction. In some embodiments, when an input current (e.g., a current greater than a threshold current for the linear operation of the TIA 14) is applied to the input of the TIA 14, analyzing the pulse widening of the voltage pulse generated by the TIA 14 (and provided at its output) may allow determining which ones of the multiple clipping circuits were activated, which, in turn, may allow determining the amplitude of the input current to the TIA 14. For example, in some embodiments, a mapping between pulse widths (or ranges thereof) of the output voltage pulses of the TIA 14 and current ranges in which different clipping circuits of the clipping arrangement 15 are activated may be stored in a memory, and a hardware processor of the system may be configured to access the mapping to determine (e.g., estimate) the input current to the TIA 14 based on the pulse width of the output voltage pulse. In some embodiments, such a mapping may be stored in a look up table (LUT).

Any suitable number of clipping circuits/paths with different clipping current path characteristics can be implemented in a clipping arrangement for a particular application. Each of such different clipping circuits/paths may be coupled to the input of the TIA 14 (i.e., different clipping circuits/paths may be in electrical parallel to one another, as shown in the present figures). Although three clipping circuits/paths are illustrated in FIG. 1, more than three clipping circuits/paths can be implemented in accordance with the principles and advantages disclosed herein. In certain instances, a clipping arrangement that includes only two clipping circuits/paths can be implemented for pulse widening in accordance with the principles and advantages disclosed herein. In some applications, more than three clipping circuits/paths may be implemented within a clipping arrangement.

In various embodiments, the different clipping circuits of the clipping arrangement 15 may be designed/optimized for particular applications. For example, although some descriptions are provided above with reference to the bipolar transistors Q0, Q1, and Q2, these descriptions are equally applicable, with some minor modifications, to other switching elements such as field-effect transistors or diodes. In some instances, there can be a trade-off between amplitude resolution and input current range (e.g., similar to the full-scale and least significant bit trade-off in an ADC). Alternatively or additionally, the capability to define different trade-off choices for sub-regions (e.g., higher resolution up to a particular current such as 1 mA current, then lower resolution up to another current such as 10 mA, etc.).

Although embodiments discussed herein may be described with reference to a negatively biased APD (or, more generally, the optoelectronic device 12) having its cathode connected to the TIA 14, any suitable principles and advantages discussed herein can be applied to a negatively biased APD (or, more generally, the optoelectronic device 12) having its anode connected to the TIA 14 (in which case the cathode of the APD may be connected to a large positive supply). An APD having its anode connected to the input of the TIA 14 can source current to the TIA. With such an APD, clipping can cause the input voltage of the TIA to increase when input current is beyond the linear range of TIA. With reversed polarity, a clipping circuit can be adjusted accordingly. For example, if in the clipping circuit of FIGS. 1 and/or 5 (i.e., embodiments where the optoelectronic device 12 sinks current from the TIA 14) the switching elements SE0, SE1, and SE2 are implemented as NPN transistors, then for the embodiments where the optoelectronic device 12 sources current to the TIA 14 the switching elements SE0, SE1, and SE2 can be implemented as PNP transistors. As another example, in the clipping circuit of FIGS. 4 and/or 5, the diodes can be flipped and have their cathodes connected to respective bias voltages. In other words, if in the clipping circuit of FIGS. 4 and/or 5 (i.e., embodiments where the optoelectronic device 12 sinks current from the TIA 14) diodes of a certain polarity is used, then for the embodiments where the optoelectronic device 12 sources current to the TIA 14 the polarity of these diodes may be reversed. For both an optoelectronic device 12 having its cathode connected to the TIA 14 and an optoelectronic device 12 having its anode connected to the TIA 14, the diode of the optoelectronic device 12 can be reverse biased. For both an optoelectronic device 12 having its cathode connected to the TIA 14 and an optoelectronic device 12 having its anode connected to the TIA 14, the relationship between impedances of the different clipping circuits may remain the same as described above. Namely, the clipping circuit configured to turn on first may have the largest impedance, while the clipping circuit configured to turn on last may have the lowest impedance, with the impedances of the different clipping circuits gradually decreasing from the clipping circuit configured to activate first to the clipping circuit configured to activate last. On the other hand, relationships between the bias voltages of the different clipping circuits for an optoelectronic device 12 having its cathode connected to the TIA 14 and an optoelectronic device 12 having its anode connected to the TIA 14 may be reversed. Namely, for an optoelectronic device 12 having its cathode connected to the TIA 14 (i.e., the optoelectronic device 12 configured to sink current from the TIA 14), the bias voltage of the clipping circuit configured to turn on first may be the highest, while the bias voltage of the clipping circuit configured to turn on last may be the lowest, with the bias voltages of the different clipping circuits gradually decreasing from the clipping circuit configured to activate first to the clipping circuit configured to activate last. On the other hand, for an optoelectronic device 12 having its anode connected to the TIA 14 (i.e., the optoelectronic device 12 configured to source current to the TIA 14), the bias voltage of the clipping circuit configured to turn on first may be the lowest, while the bias voltage of the clipping circuit configured to turn on last may be the highest, with the bias voltages of the different clipping circuits gradually increasing from the clipping circuit configured to activate first to the clipping circuit configured to activate last. For example, in some embodiments of the optoelectronic device 12 sourcing current to the TIA 14, the bias voltage $V_2$ may be at least 100 mV lower than the bias voltage $V_1$, e.g., at least 200 mV lower, at least 500 mV lower, or at least 700 mV lower. Similarly, in some embodiments of the optoelectronic device 12 sourcing current to the TIA 14, the bias voltage $V_1$ may be at least 100 mV lower than the bias voltage $V_{CLIP}$, e.g., at least 200 mV lower, at least 500 mV lower, or at least 700 mV lower (in such embodiments, in general, the difference between the bias voltages $V_2$ and $V_1$ may be different from the difference between the bias voltages $V_1$ and $V_{CLIP}$). In some embodiments of the optoelectronic device 12 sourcing current to the TIA 14, the bias voltage of the clipping circuit configured to turn on first (i.e., the bias voltage $V_2$ of CC2) may be lower than a voltage at the input of the TIA 14 if an input current applied to the input of the TIA 14 is equal to or lower than the maximum current for which the TIA 14 is operable in a linear mode.

The clipping arrangement 15 can adjust the input voltage for the TIA 14 differently based on current from the optoelectronic device 12. The clipping arrangement 15 can provide differentiation in the recovery time after current pulses from the optoelectronic device 12. Accordingly, pulse width can provide amplitude information about the input current to the TIA 14 while the TIA is in a saturation mode of operation.

A pulse can be widened for different input voltages to preserve amplitude information at the output of the TIA 14. The different pulse widths correspond to different input currents provided to the TIA 14 by the optoelectronic device 12. Based on the pulse width, a processing circuit can determine amplitude of current from the optoelectronic device 12 for currents that are outside of the linear range of the TIA 14.

Figure 2:
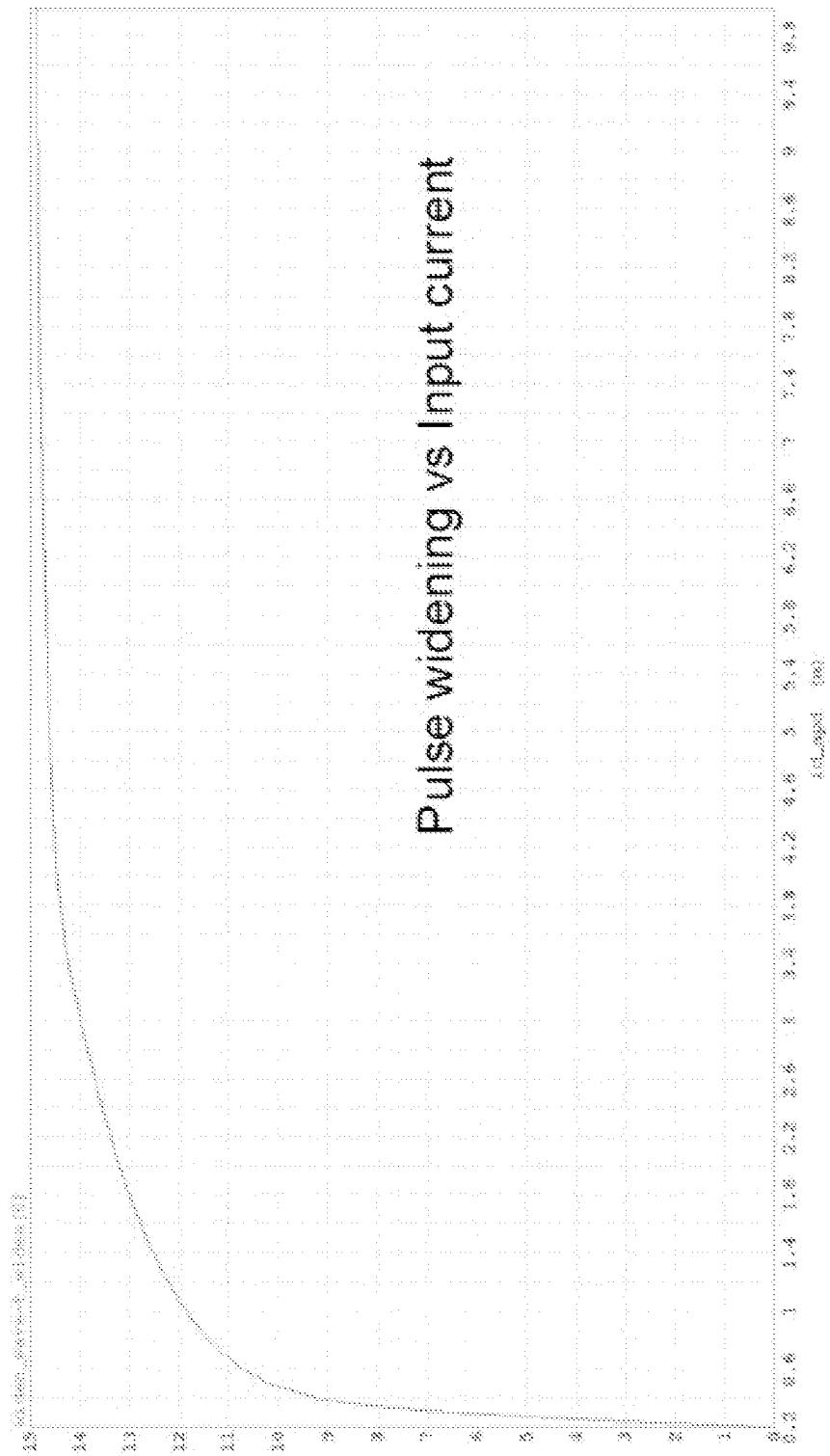
FIG. 2 is a graph of pulse widening of the TIA output versus input current for the LIDAR receiver of FIG. 1, according to some embodiments of the present disclosure.

FIG. 2 is a graph of pulse widening of the TIA output versus input current for the LIDAR receiver 10 of FIG. 1. This graph illustrates that changes in input current to the TIA 14 can provide detectable differences in pulse width.

Figure 3:
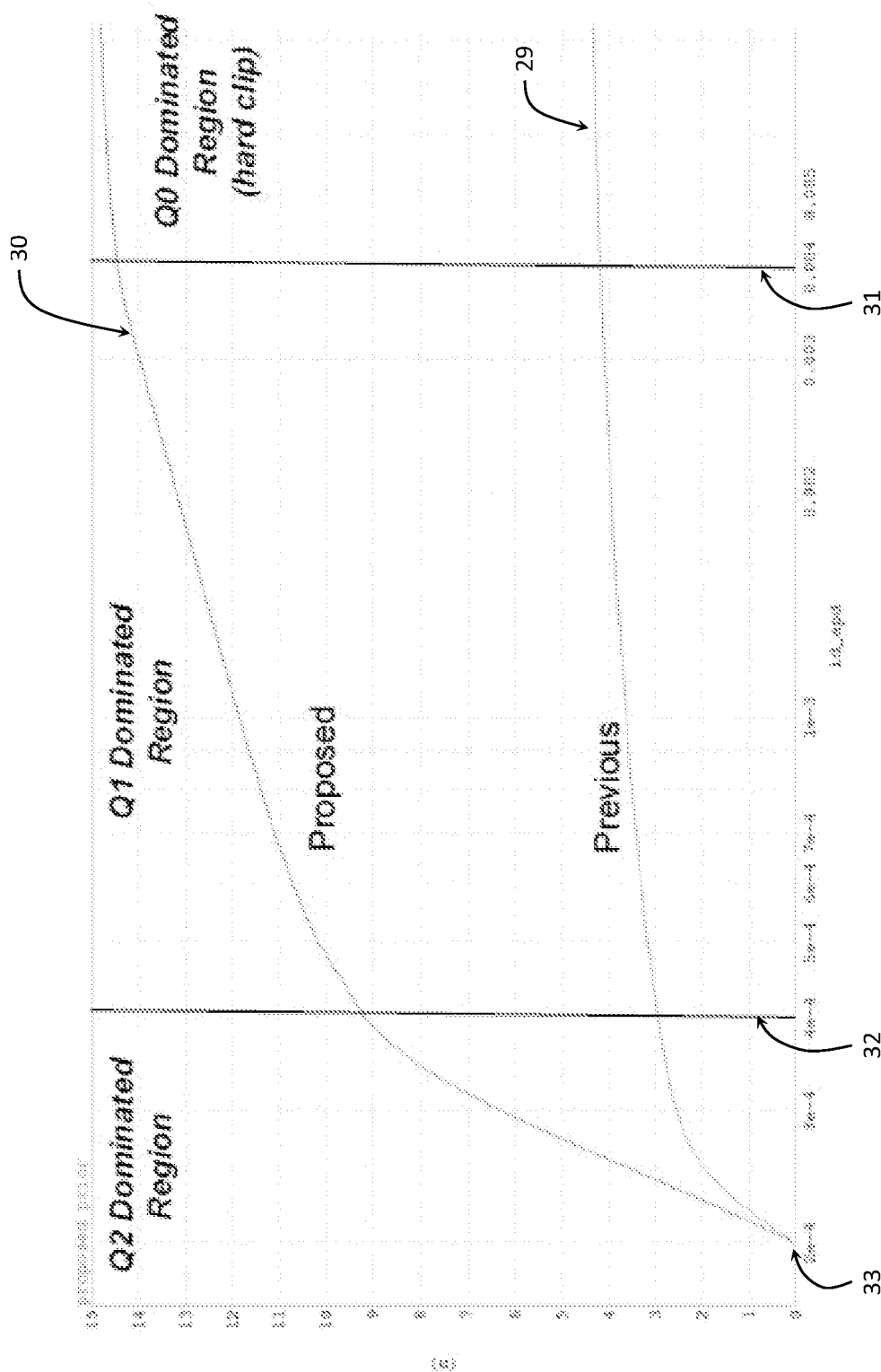
FIG. 3 is a graph comparing pulse widening for a TIA output versus PD current for the LIDAR receiver of FIG. 1 and for a previous design.

FIG. 3 is a graph comparing pulse widening for a TIA output versus PD current for the LIDAR receiver 10 of FIG. 1 (a curve 30 shown in FIG. 3) and for a previous design (a curve 29 shown in FIG. 3). The current on the x-axis is on a logarithmic scale. In this graph, pulse width is represented by a duration of time in nanoseconds on the y-axis. This graph illustrates that the LIDAR receiver 10 of FIG. 1 has more pulse widening for input currents in the saturation region of the TIA 14 compared to previous designs. This can make changes in the pulse width easier to detect. Accordingly, amplitude information can be extracted from pulse width of the output voltage of the TIA 14.

As shown in FIG. 3, the pulse width of the output voltage of the TIA 14 has three regions in which different clipping current paths of the clipping arrangement 15 dominates. For the lower end of the current range of this graph, the clipping circuit that includes bipolar transistor Q2 (or any other switching element SE2) can primarily determine the pulse width. For a middle portion of the current range of this graph, the clipping circuit that includes bipolar transistor Q1 (or any other switching element SE1) can primarily determine the pulse width. For a higher end of the current range of this graph, the clipping circuit that includes bipolar transistor Q0 (or any other switching element SE0) can primarily determine the pulse width. This region corresponds to hard clipping. For the region where the clipping circuit that includes bipolar transistor Q0 (or any other switching element SE0) dominates pulse width and hard clipping is present, it can be more difficult to determine pulse width as there is less variation in pulse width as current changes (i.e., the slope of the curve 30 is relatively small). However, for the region where the clipping circuit that includes bipolar transistor Q1 (or any other switching element SE1) dominates pulse width, i.e., the region between currents indicated in FIG. 3 with vertical lines 31 and 32, the slope is not so small and it is possible to determine pulse width with sufficient accuracy to estimate/determine the input current. For example, in some embodiments, for a range of input currents between that associated with the line 32 and that associated with the line 31 shown in FIG. 3, a slope of the curve 30 may be at least 0.1 ns per mA, e.g., at least 0.2 ns/mA, at least 0.3 ns/mA, or at least 0.5 ns/mA. Accordingly, the clipping circuit can be arranged such that amplitude information for a desired range of current in the saturation range of the TIA 14 is below the current level where hard clipping occurs.

Figure 4:
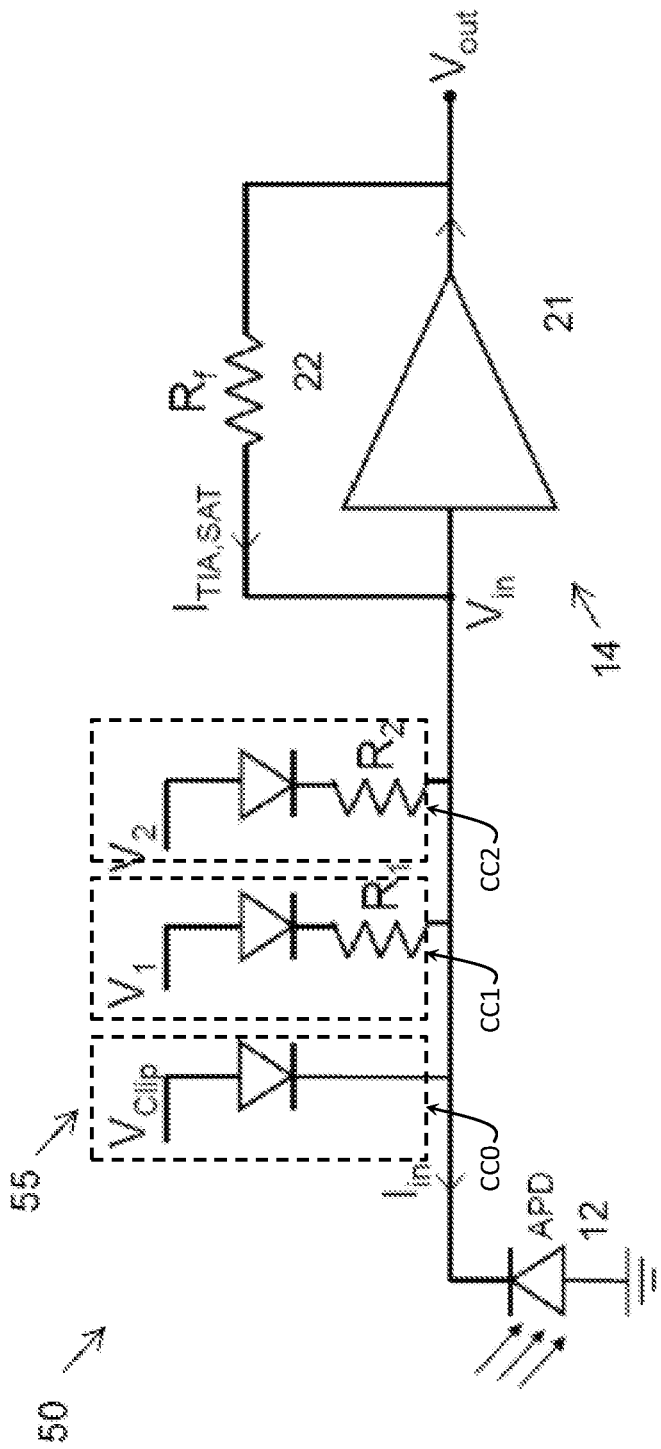
FIG. 4 is a schematic diagram of a LIDAR receiver with a clipping arrangement configured to control pulse widening according to another embodiment.
Figure 5:
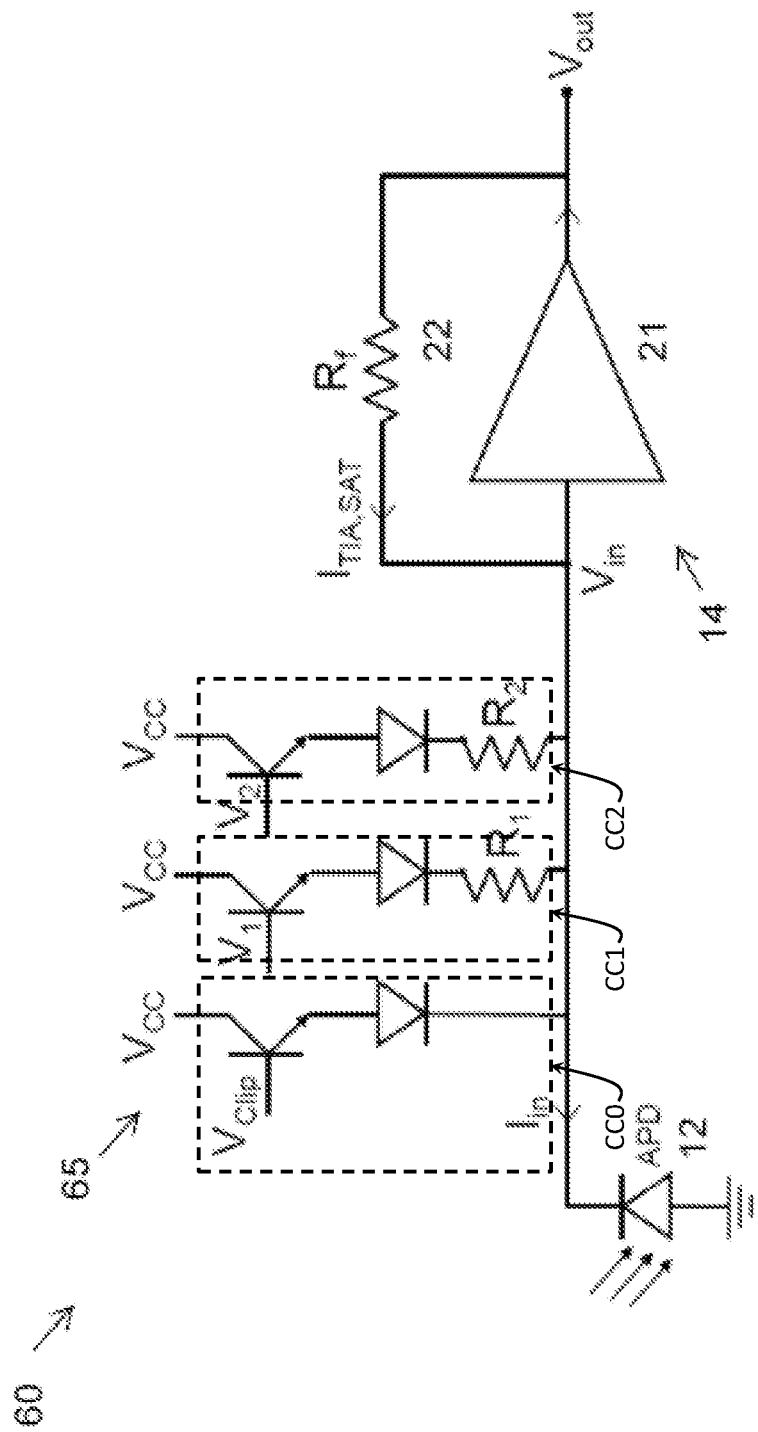
FIG. 5 is a schematic diagram of a LIDAR receiver with a clipping arrangement configured to control pulse widening according to another embodiment.

Although clipping arrangement 15 of FIG. 1 includes bipolar transistors, other suitable clipping circuits can alternatively or additionally be implemented in accordance with any suitable principles and advantages disclosed herein. For instance, clipping circuits can include diodes in place of or in series with bipolar transistors. FIGS. 4 and 5 illustrate examples of such clipping circuits. In certain instances, one clipping current path can include a diode and another clipping current path can include bipolar transistor. Bipolar transistors and diodes are examples of switching elements arranged to receive a bias voltage that can be implemented in clipping current paths of a clipping circuit.

FIG. 4 is a schematic diagram of a LIDAR receiver 50 with a clipping arrangement 55 arranged to control pulse widening according to another embodiment. In the LIDAR receiver 50, the clipping arrangement 55 is included to control pulse widening for input currents outside the linear range of the TIA 14. The diodes in the clipping arrangement 55 can be implemented in place of bipolar transistors in the clipping arrangement 15 of FIG. 1. The diodes may receive bias voltages that set a voltage at which each respective diode clips input current to the TIA 14. The diodes can receive the bias voltages at their anodes as illustrated. Diodes of two of the illustrated clipping current paths have resistors with resistances R1 and R2, respectively, coupled between their cathodes and the input of the TIA 14 in FIG.

4. Besides diodes being included in place of bipolar transistors, the LIDAR receiver 50 can otherwise implement similar functionality as the LIDAR receiver 10 of FIG. 1, as indicated in FIG. 4 by using the same reference indications, e.g., CC0, CC1, and CC2, and the same reference numerals, e.g., 12, 14, 21, 22, as those used in FIG. 1 (the descriptions of which is, therefore, in the interests of brevity, are not repeated here). For instance, control of pulse widening in the LIDAR receiver 50 can be implemented similarly to the pulse widening to preserve amplitude information for the saturation region of the TIA discussed above. Moreover, the LIDAR receiver 50 can also implement any additional circuitry from the LIDAR receiver 10 coupled to the output of the TIA 14.

FIG. 5 is a schematic diagram of a LIDAR receiver 60 with a clipping arrangement 65 arranged to control pulse widening according to another embodiment.

In the LIDAR receiver 60, the clipping arrangement 65 are included to control pulse widening for input currents outside the linear range of the TIA 14. The clipping arrangement 65 may include bipolar transistors in series with diodes. In some other applications, field effect transistors in series with diodes can alternatively be implemented in a clipping circuit. Besides different clipping circuits, the LIDAR receiver 60 can otherwise implement similar functionality as the LIDAR receiver 10 of FIG. 1, as indicated in FIG. 5 by using the same reference indications, e.g., CC0, CC1, and CC2, and the same reference numerals, e.g., 12, 14, 21, 22, as those used in FIG. 1 (the descriptions of which, therefore, in the interests of brevity, are not repeated here). For instance, control of pulse widening in the LIDAR receiver 60 can be implemented similarly to the pulse widening to preserve amplitude information for the saturation region of the TIA discussed above. Moreover, the LIDAR receiver 60 can also implement any additional circuitry from the LIDAR receiver 10 coupled to the output of the TIA 14.

In certain implementations degeneration resistors (or other resistors arranged between a transistor and/or a diode and an input of the TIA) can be omitted. In such implementations, the difference in bias voltages of the clipping circuit can be sufficient to control pulse widening of the output voltage of the TIA so that amplitude information for the saturation region of the TIA can be extracted. Moreover, in such implementations, a switching element with a higher bias voltage can be a smaller transistor than another switching element with a lower bias voltage.

Figure 6:
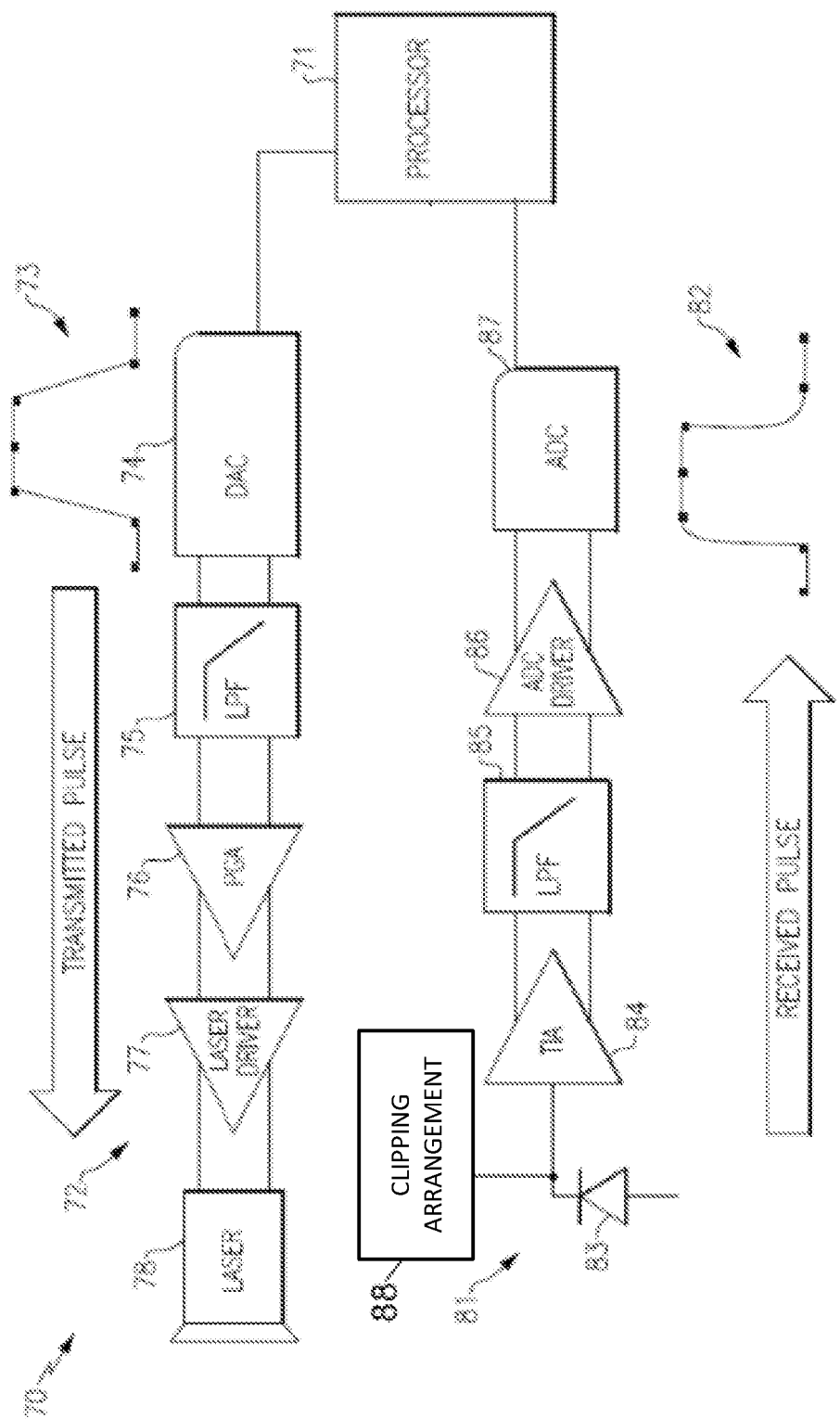
FIG. 6 is a block diagram of an example LIDAR system, according to some embodiments of the present disclosure.

FIG. 6 is a block diagram of an example laser range finding system 70 according to an embodiment. The illustrated Laser range finding system 70 includes a processor 71, a transmitter signal chain 72, and receiver signal chain 81. The laser range finding system 70 is an example system that can include LIDAR receivers discussed herein. The receiver signal chain 81 can include a clipping circuit that can control pulse widening for a TIA output in accordance with any suitable principles and advantages discussed herein. In some instances, a receiver of a laser range finding system can be implemented separately from a transmitter. The illustrated transmitter signal chain 72 includes a digital-to-analog converter (DAC) 74, a low pass filter (LPF) 75, a programmable gain amplifier (PGA) 76, a laser driver 77, and a laser 78. The illustrated receiver chain 81 includes a photodiode (PD) 83, a TIA 84, a LPF 85, an ADC driver 86, an ADC 87, and a clipping arrangement 88. In some instances, a receiver chain can include a PGA coupled between the TIA 84 and the LPF 85. Such a PGA could be implemented in place of or in addition to the ADC driver 87.

The illustrated transmitter chain 72 includes a laser 78 driven by the laser driver 77 to emit laser light corresponding to a pulse 73. While FIG. 6 relates to a laser range finding system that includes the laser 78, any suitable principles and advantages discussed herein can be implemented with a light range finding system that includes any suitable light source. In some embodiments, the pulse 73 can be generated by the processor 71 and can propagate from the DAC 74 through the LPF 75 and the PGA 76 to the laser driver 77 to drive the laser 78.

The emitted light can reach an object or a target and reflected light can be received by the PD 83 of the receiver chain 81. The reflected light can be detected at the PD 83. The PD 83 can be an avalanche photodiode, for example. The PD 83 can generate a received pulse 82 based on the received reflected light and the received pulse 82 can be processed by the TIA 84 and the LPF 85. The LPF 85 can be a tunable filter in certain embodiments. As illustrated, the LPF 85 is coupled in a signal path between the TIA 84 and the ADC driver 86. In some other implementations, an LPF can be coupled in a signal path between the ADC driver 86 and the ADC 87. The ADC driver 86 can drive the ADC 87. The ADC 87 can convert the received pulse to a digital signal.

The clipping arrangement 88 can be implemented in accordance with any suitable principles and advantages of the clipping arrangements disclosed herein. The clipping arrangement 88 can clip an input of the TIA 84 and control pulse widening of an output voltage pulse of the TIA 84 so as to preserve amplitude information for input currents to the TIA 84 that are outside of the range of current for which the TIA 84 is operable in a linear mode. For example, in various embodiments, the clipping arrangement 88 may be implemented as any of the clipping arrangements 15, 55, 65, any further embodiments of these clipping arrangements, or any combination of these clipping arrangements.

The processor 71 can be a hardware processor. The processor 71 can be a baseband digital signal processor. The processor 71 can determine a distance between an object and the laser range finding system 70. The processor 71 can output a signal indicative of the distance. The processor 71 can identify an object from which the pulse of light reflected from the PD 83 based at least partly on the width of a pulse generated by the TIA 84. The processor 71 can output data identifying the object.

Figure 7:
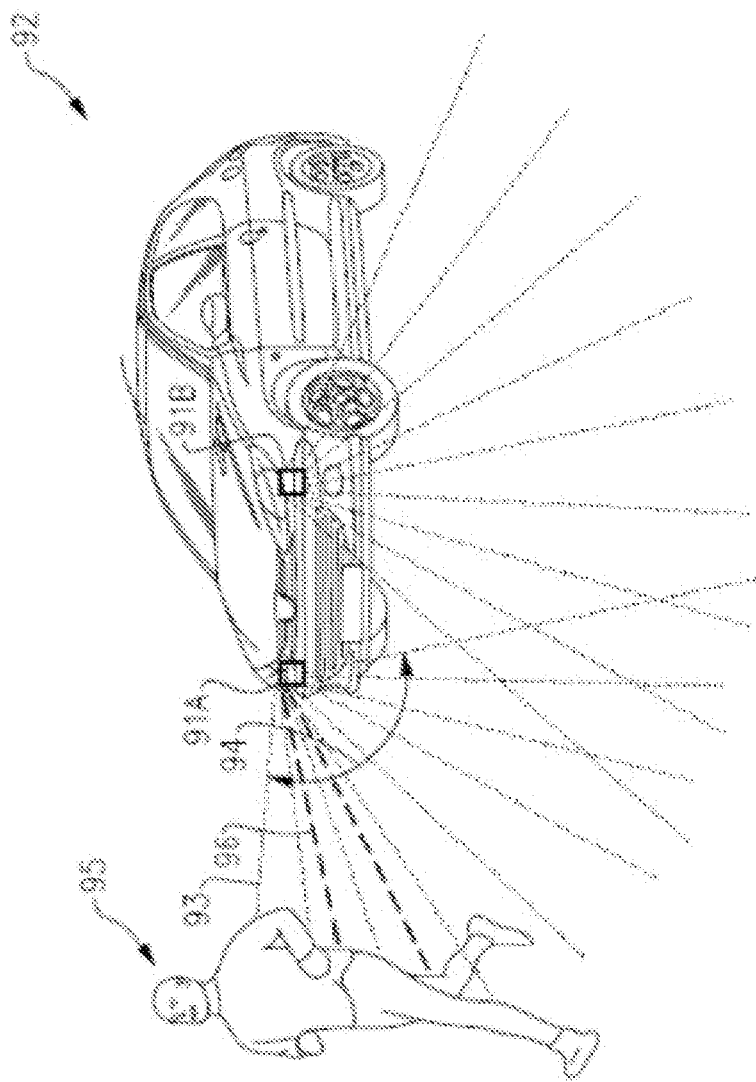
FIG. 7 shows a LIDAR system integrated with an automobile, according to some embodiments of the present disclosure.

FIG. 7 shows a LIDAR system integrated with an automobile. This is an example application in which LIDAR receivers discussed herein can be implemented. FIG. 7 illustrates two LIDAR systems 91A and 91B integrated with the automobile 92. A first LIDAR system 91A is positioned near a right headlight of the automobile 92 and the second LIDAR system 91B is positioned near the left headlight of automobile 92. The LIDAR systems 91A and/or 91B can implement any suitable principles of the LIDAR receivers discussed herein. The LIDAR systems 91A and/or 92B can detect a distance between the automobile 92 and the object 95.

As illustrated, a transmitter of the LIDAR system 91A can transmit pulses of light 93 at an angle 94. The transmitted light 93 can travel through the air and reach an object 95. The object 95 can reflect back pulses of light 96 to a receiver of the LIDAR system 91A. Embodiments discussed herein can generate information to identify the object 95. The pulses of light 93 can be transmitted three dimensionally to obtain three dimensional information of the surroundings.

One or more additional LIDAR systems can be integrated with the automobile 92 to cover a wider range of area for detection and/or to obtain additional information regarding a selected area. In some embodiments, data collected by each LIDAR system can be combined to analyze information from a wider range of area and/or to provide additional information about a selected area. In some embodiments, the angle 94 can be adjusted and the angle 94 can be in any suitable range.

SELECT EXAMPLES

Example A1 provides a receiver for a light detection and ranging system with pulse width control, the receiver including: an optoelectronic device configured to receive light and to convert the light to a current; a transimpedance amplifier configured to generate a voltage pulse from the current, the transimpedance amplifier being operable in a linear mode for a range of power of the light; and a clipping circuit configured to clip an input voltage of the transimpedance amplifier, the clipping circuit further configured to adjust a width of the voltage pulse based on an amplitude of the light outside of the range of power of the light for which the transimpedance amplifier is operable in the linear mode.

Example A2 provides the receiver of Example A1, wherein the clipping circuit comprises clipping current paths configured to receive different respective bias voltages and control width of the voltage pulse in different respective ranges of amplitude of light outside of the range of power of the light for which the transimpedance amplifier is operable in the linear mode.

Example A3 provides the receiver of Example A2, wherein the clipping current paths comprise three clipping current paths.

Example A4 provides the receiver of Example A1, wherein the clipping circuit comprises: a first clipping current path comprising a first switching element configured to receive a bias voltage, the first switching element being coupled to an input node of the transimpedance amplifier; and a second clipping current path comprising a second switching element configured to receive a different bias voltage and a resistor coupled between the second switching element and the input node of the transimpedance amplifier.

Example A5 provides the receiver of Example A4, wherein the second switching element comprises a bipolar transistor.

Example A6 provides the receiver of Example A4, wherein the second switching element comprises a diode.

Example A7 provides the receiver of Example A4, wherein a resistance of the resistor is less than a resistance of a feedback resistor of the transimpedance amplifier.

Example A8 provides the receiver of Example A4, wherein the clipping circuit comprises a third clipping current path comprising a third switching element configured to receive a third bias voltage and a second resistor coupled between the third switching element and the input node of the transimpedance amplifier, and wherein the third bias voltage is different than both the bias voltage and the different bias voltage.

Example A9 provides the receiver of Example A1, wherein the optoelectronic device comprises an avalanche photodiode.

Example A10 provides the receiver of Example A1, wherein the transimpedance amplifier is a shunt-feedback transimpedance amplifier.

Example A11 provides a current pulse processing circuit with voltage pulse width control, the current pulse processing circuit comprising: a transimpedance amplifier configured to generate a voltage pulse from a current pulse, the transimpedance amplifier operable in a linear mode for a range of current; and a clipping circuit configured to clip an input voltage of the transimpedance amplifier, the clipping circuit further configured to adjust a width of the voltage pulse based on an amplitude of the current pulse outside of the range of current for which the transimpedance amplifier is operable in the linear mode.

Example A12 provides the current pulse processing circuit of Example A11, wherein the clipping circuit comprises a plurality of switching elements configured to receive different respective bias voltages, wherein the switching elements are configured to control the width of the voltage pulse for different ranges of amplitude of the current pulse outside of the range of current for which the transimpedance amplifier is operable in the linear mode.

Example A13 provides the current pulse processing circuit of Example A11, wherein the clipping circuit is configured to adjust the width of the voltage pulse with different characteristics for different sub-regions of a saturated dynamic range of the transimpedance amplifier.

Example A14 provides the current pulse processing circuit of Example A11, wherein the clipping circuit comprises: a first clipping current path comprising a first bipolar transistor configured to receive a first bias voltage, the first bipolar transistor being coupled to an input node of the transimpedance amplifier; and a second clipping current path comprising a second bipolar transistor configured to receive a second bias voltage and a resistor coupled between the second bipolar transistor and the input node of the transimpedance amplifier.

Example A15 provides the current pulse processing circuit of Example A11, wherein the clipping circuit comprises: a first clipping current path comprising a first diode configured to receive a first bias voltage, the first diode being coupled to an input node of the transimpedance amplifier; and a second clipping current path comprising a second diode configured to receive a second bias voltage and a resistor coupled between the second diode and the input node of the transimpedance amplifier.

Example A16 provides the current pulse processing circuit of Example A11, wherein the clipping circuit comprises: a first clipping current path comprising a first switching element configured to receive a first bias voltage, the first switching element being coupled to an input node of the transimpedance amplifier; and a second clipping current path comprising a second switching element configured to receive a second bias voltage and a first resistor coupled between the second switching element and the input node of the transimpedance amplifier; and a third clipping current path comprising a third switching element configured to receive a third bias voltage and a second resistor coupled between the third switching element and the input node of the transimpedance amplifier, wherein the second resistor has a higher resistance than the first resistor, and wherein the second third bias voltage has a higher magnitude than the second bias voltage.

Example A17 provides a method of processing a pulse of light in a light detection and ranging receiver with pulse width control, the method comprising: converting the pulse of light to a current pulse, the pulse of light having an optical power above a range for which a transimpedance amplifier of the light detection and ranging receiver operates in a linear region; generating a voltage pulse from the current pulse using the transimpedance amplifier; and controlling a width of the voltage pulse based on an amplitude of the received pulse of light for which the optical power is above the range for which the transimpedance amplifier operates in the linear region.

Example A18 provides the method of Example A17, further comprising identifying an object from which the pulse of light reflected based at least partly on the width of the voltage pulse.

Example A19 provides the method of Example A18, further comprising determining a distance between the object and the light detection and ranging receiver based on the voltage pulse.

Example A20 provides the method of Example A17, further comprising: converting a second pulse of light to a second current pulse, the second pulse of light having a second optical power within the range for which the transimpedance amplifier operates in the linear region; and amplifying the second current pulse with the transimpedance amplifier.

Example B1 provides a TIA arrangement, e.g., to be used in a receiver, e.g., in a LIDAR system. The TIA arrangement includes a TIA and a clipping arrangement including a first clipping circuit and a second clipping circuit, where each of the first clipping circuit and the second clipping circuit is coupled to an input of the TIA and configured to clip an input voltage of the TIA, an impedance of the second clipping circuit is larger than an impedance of the first clipping circuit, and, when the TIA is coupled to a device that is configured to sink current from the TIA, a bias voltage of the second clipping circuit is higher than a bias voltage of the first clipping circuit.

Example B2 provides the TIA arrangement according to example B1, where the bias voltage of the second clipping circuit is at least 100 millivolts (mV) higher than the bias voltage of the first clipping circuit, e.g., at least 200 mV higher, at least 500 mV higher, or at least 700 mV higher. Having multiple clipping circuits with different bias voltages may help ensure that different clipping circuits turn on at different times, depending on the voltage Vin at the input of the TIA.

Example B3 provides the TIA arrangement according to examples B1 or B2, where the bias voltage of the second clipping circuit is higher than a voltage at the input of the TIA if an input current applied to the input of the TIA is equal to or greater than the maximum current for which the TIA is operable in a linear mode (e.g., the bias voltage of the second clipping circuit is higher than a voltage at the input of the TIA if the input current applied to the input of the TIA is at or above the linear saturation region of the TIA).

Example B4 provides a TIA arrangement, e.g., to be used in a receiver, e.g., in a LIDAR system. The TIA arrangement includes a TIA and a clipping arrangement including a first clipping circuit and a second clipping circuit, where each of the first clipping circuit and the second clipping circuit is coupled to an input of the TIA and configured to clip an input voltage of the TIA, an impedance of the second clipping circuit is larger than an impedance of the first clipping circuit, and, when the TIA is coupled to a device that is configured to source current to the TIA, a bias voltage of the second clipping circuit is lower than a bias voltage of the first clipping circuit.

Example B5 provides the TIA arrangement according to example B4, where the bias voltage of the second clipping circuit is at least 100 millivolts (mV) lower than the bias voltage of the first clipping circuit, e.g., at least 200 mV lower, at least 500 mV lower, or at least 700 mV lower. Having multiple clipping circuits with different bias voltages ensures that different clipping circuits turn on at different times, depending on the voltage Vin at the input of the TIA.

Example B6 provides the TIA arrangement according to examples B4 or B5, where the bias voltage of the second clipping circuit is lower than a voltage at the input of the TIA if an input current applied to the input of the TIA is equal to or lower than the maximum current for which the TIA is operable in a linear mode (e.g., the bias voltage of the second clipping circuit is lower than a voltage at the input of the TIA if the input current applied to the input of the TIA is at or below the linear saturation region of the TIA).

Example B7 provides the TIA arrangement according to any one of the preceding examples B, where a voltage level of clipping of the first clipping circuit is based on (e.g., may be at least partially defined by) the bias voltage of the first clipping circuit, and a voltage level of clipping of the second clipping circuit is based on the bias voltage of the second clipping circuit.

Example B8 provides the TIA arrangement according to any one of the preceding examples B, where the impedance of the second clipping circuit is at least 50% larger than the impedance of the first clipping circuit, e.g., at least 100% larger, at least 200% larger, or at least 500% larger. Having multiple clipping circuits with different impedances allows extending the range of input currents (i.e., currents applied to the input of the TIA) outside of the linear mode of the TIA for which evaluation of a pulse width of voltage pulses at the output of the TIA still allows estimation of the magnitude of the input currents input to the TIA.

Example B9 provides the TIA arrangement according to any one of the preceding examples B, where the first clipping circuit is configured to turn on and clamp an input voltage of the TIA when a current greater than a first current is applied to the input of the TIA, and the second clipping circuit is configured to turn on and clamp the input voltage of the TIA when a current greater than a second current is applied to the input of the TIA, the first current being larger than the second current.

Example B10 provides the TIA arrangement according to example B9, where the first current is at least 50% larger than the second current, e.g., at least 100% larger, at least 200% larger, or at least 500% larger.

Example B11 provides the TIA arrangement according to examples B9 or B10, where the TIA is operable in a linear mode for a range of currents applied to the input of the TIA, and each of the first current and the second current is outside of the range of currents for which the TIA is operable in the linear mode.

Example B12 provides the TIA arrangement according to any one of examples B9-11, where the TIA is configured to generate voltage pulses when input currents are applied to the input of the TIA, and for a range of the input currents between the second current and the first current, a slope of a curve of lengths of the voltage pulses versus the input currents is at least 0.1 nanoseconds (ns) per milliampere (mA), e.g., at least 0.2 ns/mA, at least 0.3 ns/mA, or at least 0.5 ns/mA.

Example B13 provides the TIA arrangement according to any one of the preceding examples B, where the TIA is configured to generate voltage pulses when input currents are applied to the input of the TIA, and the first clipping circuit and the second clipping circuit are configured to control width of the voltage pulses in different respective ranges of amplitude of the input currents, the different respective ranges being outside of a range of the input currents for which the TIA is operable in a linear mode.

Example B14 provides the TIA arrangement according to any one of the preceding examples B, where the first clipping circuit includes a first switching element configured to receive a bias voltage, the first switching element being coupled to the input of the TIA; and where the second clipping circuit includes a second switching element configured to receive a different bias voltage, and further includes a resistor coupled between the second switching element and the input of the TIA.

Example B15 provides the TIA arrangement according to example B14, where at least one of the first switching element and the second switching element includes a bipolar transistor.

Example B16 provides the TIA arrangement according to example B14, where at least one of the first switching element and the second switching element includes a field-effect transistor.

Example B17 provides the TIA arrangement according to any one of examples B14-16, where at least one of the first switching element and the second switching element includes a diode. In various embodiments, the diode may be, e.g., a Schottky diode or a p-n junction diode.

Example B18 provides the TIA arrangement according to any one of examples B14-17, where a resistance of the resistor is less than a resistance of a feedback resistor of the TIA.

Example B19 provides the TIA arrangement according to any one of examples B14-18, where the clipping arrangement further includes a third clipping circuit, coupled to the input of the TIA and configured to clip the input voltage of the TIA, the third clipping circuit includes a third switching element configured to receive a different bias voltage from the first and second switching elements, and further includes a second resistor coupled between the third switching element and the input of the TIA, and a resistance of the resistor is smaller than a resistance of the second resistor.

Example B20 provides the TIA arrangement according to example B19, where an impedance of the third clipping circuit is larger than an impedance of the second clipping circuit, e.g., at least 50% larger, at least 100% larger, at least 200% larger, or at least 500% larger.

In one further example of the TIA arrangement according to examples B19 or B20, when the TIA is coupled to a device that is configured to sink current from the TIA, a bias voltage of the third clipping circuit is higher than a bias voltage of the second clipping circuit, e.g., at least 200 mV higher, at least 500 mV higher, or at least 700 mV higher.

In another further example of the TIA arrangement according to examples B19 or B20, when the TIA is coupled to a device that is configured to source current to the TIA, a bias voltage of the third clipping circuit is lower than a bias voltage of the second clipping circuit, e.g., at least 200 mV lower, at least 500 mV lower, or at least 700 mV lower.

Example B21 provides the TIA arrangement according to any one of the preceding examples B, where the TIA is a shunt-feedback TIA.

Example B22 provides the TIA arrangement according to any one of the preceding examples B, where the device is a photodetector configured to receive light and to convert the light to a current, and the current is applied to the input of the TIA.

Example B23 provides the TIA arrangement according to example B22, where the photodetector includes an avalanche photodiode.

Example B24 provides a receiver for a LIDAR system, the receiver including a photodetector and a TIA arrangement that includes a TIA and a clipping arrangement including a first clipping circuit and a second clipping circuit. The photodetector is configured to receive a light pulse and to generate a current pulse based on the received light pulse. The current pulse is applied to an input of the TIA, and the TIA is configured to convert the current pulse to a voltage pulse. Each of the first clipping circuit and the second clipping circuit is coupled to an input of the TIA and configured to clip an input voltage of the TIA. An impedance of the second clipping circuit is larger than an impedance of the first clipping circuit. When the TIA is coupled to a device that is configured to sink current from the TIA, a bias voltage of the second clipping circuit is higher than a bias voltage of the first clipping circuit. When the TIA is coupled to a device that is configured to source current to the TIA, a bias voltage of the second clipping circuit is lower than a bias voltage of the first clipping circuit.

Example B25 provides the receiver according to example B24, where the first clipping circuit is configured to turn on and clip an input voltage of the TIA when a magnitude of the current pulse is greater than a first current magnitude (i.e., the first clipping circuit is configured to turn on when a current having a magnitude greater than the first current magnitude is applied to the input of the TIA), and the second clipping circuit is configured to turn on and clip the input voltage of the TIA when the magnitude of the current pulse is greater than a second current magnitude (i.e., the second clipping circuit is configured to turn on when a current having a magnitude greater than the second current magnitude is applied to the input of the TIA), the first current magnitude being larger than the second current magnitude.

Example B26 provides the receiver according to example B25, where when both the second clipping circuit and the first clipping circuit are turned on, the voltage pulse has a first pulse width, and when only the second clipping circuit is turned on, the voltage pulse has a second pulse width, the first pulse width being greater than the second pulse width.

Example B27 provides the receiver according to examples B25 or B26, where the TIA is operable in a linear mode for a range of currents applied to the input of the TIA, and where each of the first current magnitude and the second current magnitude is outside of the range of currents for which the TIA is operable in the linear mode.

Example B28 provides the receiver according to any one of examples B24-27, further including a processor, configured to determine a magnitude of the current pulse based on a pulse width of the voltage pulse.

Example B29 provides the receiver according to any one of examples B24-28, where the light pulse is a light pulse reflected from an object, and the receiver further includes a processor configured to determine a distance to the object based on a pulse width of the voltage pulse.

Example B30 provides a method of estimating an amplitude of a current pulse generated by a photodetector, where an output of the photodetector is coupled to an input of a transimpedance amplifier (TIA), and where a clipping arrangement including a plurality of clipping circuits is also coupled to the input of the TIA, different clipping circuits configured to be activated to start clipping an input voltage of the TIA at different amplitudes of the current pulse. The method includes a hardware processor configured to determine a pulse width of a voltage pulse generated by the TIA based on the input current; use the pulse width of the voltage pulse to determine which one or more of the clipping circuits of the clipping arrangement were activated to clip the input voltage of the TIA when the current pulse was applied to the input of the TIA; and estimate a range for the amplitude of the current pulse based on the determination of which one or more of the clipping circuits of the clipping arrangement were activated to clip the input voltage of the TIA when the current pulse was applied to the input of the TIA.

Example B31 provides the method according to example B30, where, together, the TIA and the clipping arrangement form a TIA arrangement according to any one of the preceding examples B, e.g., according to any one of examples B1-22.

Example B32 provides a method of operating a TIA arrangement according to any one of the preceding examples B, e.g., according to any one of examples B1-22.

Example B33 provides a method of operating a receiver arrangement according to any one of the preceding examples B, e.g., according to any one of examples B23-29.

Other Implementation Notes, Variations, and Applications

Principles and advantages discussed herein can be used in any device where an input port of a TIA is coupled to an output port of a device that generates current pulses. For example, aspects of this disclosure can be implemented in various range finding systems. For example, aspects of this disclosure can be implemented in any suitable LIDAR system such as, for example, automotive LIDAR, industrial LIDAR, space LIDAR, military LIDAR, etc. LIDAR systems can include a receiver or a transmitter and a receiver. LIDAR systems can be integrated with a vehicle, such as an automobile, a drone such as an unmanned flying machine, an autonomous robot, or a space vehicle. LIDAR systems can transmit and/o receive laser light. LIDAR systems can be used for three-dimensional sensing applications. LIDAR systems can be used with augmented reality technology. Moreover, aspects of this disclosure can be implemented in various electronic devices. Examples of the electronic devices can include, but are not limited to, electronic products, parts of electronic products such as integrated circuits, vehicular electronics such as automotive electronics, etc. Further, the electronic devices can include unfinished products.

While certain embodiments have been described, these embodiments have been presented by way of example, and are not intended to limit the scope of the disclosure. For example, while some embodiments refer to an APD being coupled to an input port of a TIA, these embodiments are equally applicable to any other device that can generate current pulses to be provided to an input of a TIA, e.g., to any other type of a PD. In another example, while some embodiments refer to a PD that sinks current from the TIA, these embodiments may be modified, in a way that would be obvious to a person of ordinary skill in the art, to a PD that sources current to the TIA, all of which embodiments being, therefore, within the scope of the present disclosure. Indeed, the novel methods, apparatus, and systems described herein may be embodied in a variety of other forms. Furthermore, various omissions, substitutions and changes in the form of the methods, apparatus, and systems described herein may be made without departing from the spirit of the disclosure. For example, circuit blocks and/or circuit elements described herein may be deleted, moved, added, subdivided, combined, and/or modified. Each of these circuit blocks and/or circuit elements may be implemented in a variety of different ways. The accompanying claims and their equivalents are intended to cover any such forms or modifications as would fall within the scope and spirit of the disclosure.

Any of the principles and advantages discussed herein can be applied to other systems, devices, integrated circuits, electronic apparatus, methods, not just to the embodiments described above. The elements and operations of the various embodiments described above can be combined to provide further embodiments. The principles and advantages of the embodiments can be used in connection with any other systems, devices, integrated circuits, apparatus, or methods that could benefit from any of the teachings herein.

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

In one example embodiment, any number of electrical circuits of the FIGS. may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional clipping circuits, controllers for configuring any of the components (e.g., controllers configured to set bias voltages and/or impedances of various clipping circuits), and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGS. may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the digital filters may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular arrangements of components. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGS. may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGS. and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to multiple clipping circuits configured to activate under different conditions, described herein, illustrate only some of the possible functions that may be executed by, or within, the TIA arrangements, receivers, and systems illustrated in the FIGS. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of the apparatus described above may also be implemented with respect to the method or process described herein and specifics in the examples may be used anywhere in one or more embodiments.

The invention claimed is:

1. A transimpedance amplifier (TIA) arrangement, comprising:
   a TIA; and
   a clipping arrangement comprising a first clipping circuit and a second clipping circuit,
   wherein:
      each of the first clipping circuit and the second clipping circuit is coupled to an input of the TIA,
      an impedance of the second clipping circuit is larger than an impedance of the first clipping circuit, and
      when the TIA is coupled to a device that is to sink current from the TIA, a bias voltage of the second clipping circuit is higher than a bias voltage of the first clipping circuit.

2. A transimpedance amplifier (TIA) arrangement, comprising:
   a TIA; and
   a clipping arrangement comprising a first clipping circuit and a second clipping circuit,
   wherein:
      each of the first clipping circuit and the second clipping circuit is coupled to an input of the TIA,
      an impedance of the second clipping circuit is larger than an impedance of the first clipping circuit, and
      when the TIA is coupled to a device that is to source current to the TIA, a bias voltage of the second clipping circuit is lower than a bias voltage of the first clipping circuit.

3. The TIA arrangement according to claim 2, wherein the bias voltage of the second clipping circuit is lower than a voltage at the input of the TIA if an input current applied to the input of the TIA is equal to or lower than the maximum current for which the TIA is operable in a linear mode.

4. The TIA arrangement according to claim 2, wherein a voltage level of clipping of the first clipping circuit is based on the bias voltage of the first clipping circuit, and a voltage level of clipping of the second clipping circuit is based on the bias voltage of the second clipping circuit.

5. The TIA arrangement according to claim 2, wherein the impedance of the second clipping circuit is at least 50% larger than the impedance of the first clipping circuit.

6. The TIA arrangement according to claim 2, wherein:
   the first clipping circuit is to clamp an input voltage of the TIA when a current greater than a first current is applied to the input of the TIA, and
   the second clipping circuit is to clamp the input voltage of the TIA when a current greater than a second current is applied to the input of the TIA, the first current being larger than the second current.

7. The TIA arrangement according to claim 6, wherein the first current is at least 50% larger than the second current.

8. The TIA arrangement according to claim 6, wherein:
   the TIA is operable in a linear mode for a range of currents applied to the input of the TIA, and
   each of the first current and the second current is outside of the range of currents for which the TIA is operable in the linear mode.

9. The TIA arrangement according to claim 8, wherein:
   the TIA is to generate voltage pulses when input currents are applied to the input of the TIA, and
   for a range of the input currents between the second current and the first current, a slope of a curve of lengths of the voltage pulses versus the input currents is at least 0.1 nanoseconds (ns) per milliampere (mA).

10. The TIA arrangement according to claim 2, wherein:
the TIA is to generate voltage pulses when input currents are applied to the input of the TIA, and
the first clipping circuit and the second clipping circuit are to control width of the voltage pulses in different respective ranges of amplitude of the input currents, outside of a range of the input currents for which the TIA is operable in a linear mode.

11. The TIA arrangement according to claim 2, wherein:
the first clipping circuit includes a first switching element,
the first switching element is coupled to the input of the TIA, and
the second clipping circuit includes a second switching element, and further includes a resistor coupled between the second switching element and the input of the TIA.

12. The TIA arrangement according to claim 11, wherein:
the clipping arrangement further includes a third clipping circuit, coupled to the input of the TIA,
the third clipping circuit includes a third switching element, and further includes a second resistor coupled between the third switching element and the input of the TIA, and
a resistance of the resistor is smaller than a resistance of the second resistor.

13. A receiver for a light detection and ranging (LIDAR) system, the receiver comprising:
a photodetector; and
a TIA arrangement that includes a TIA and a clipping arrangement comprising a first clipping circuit and a second clipping circuit,
wherein:
the photodetector is to receive a light pulse and to generate a current pulse based on the received light pulse,
the TIA is to convert the current pulse applied to an input of the TIA to a voltage pulse,
each of the first clipping circuit and the second clipping circuit is coupled to the input of the TIA,
when the TIA is coupled to a device that is to sink current from the TIA, a bias voltage of the second clipping circuit is higher than a bias voltage of the first clipping circuit, and
when the TIA is coupled to a device that is to source current to the TIA, the bias voltage of the second clipping circuit is lower than the bias voltage of the first clipping circuit.

14. The receiver according to claim 13, wherein:
the first clipping circuit is to clip an input voltage of the TIA when a magnitude of the current pulse is greater than a first current magnitude, and
the second clipping circuit is to clip the input voltage of the TIA when the magnitude of the current pulse is greater than a second current magnitude, the first current magnitude being larger than the second current magnitude.

15. The receiver according to claim 13, wherein:
when both the second clipping circuit and the first clipping circuit are on, the voltage pulse has a first pulse width, and
when the second clipping circuit is on and the first clipping circuit is off, the voltage pulse has a second pulse width, the first pulse width being greater than the second pulse width.

16. The receiver according to claim 14, wherein the TIA is operable in a linear mode for a range of currents applied to the input of the TIA, and wherein each of the first current magnitude and the second current magnitude is outside of the range of currents for which the TIA is operable in the linear mode.

17. The receiver according to claim 13, wherein an impedance of the second clipping circuit is larger than an impedance of the first clipping circuit.

18. The TIA arrangement according to claim 1, wherein:
the first clipping circuit is to clamp an input voltage of the TIA when a current greater than a first current is applied to the input of the TIA, and
the second clipping circuit is to clamp the input voltage of the TIA when a current greater than a second current is applied to the input of the TIA, the first current being larger than the second current.

19. The TIA arrangement according to claim 1, wherein:
the TIA is to generate voltage pulses when input currents are applied to the input of the TIA, and
the first clipping circuit and the second clipping circuit are to control width of the voltage pulses in different respective ranges of amplitude of the input currents, outside of a range of the input currents for which the TIA is operable in a linear mode.

20. The TIA arrangement according to claim 1, wherein:
the first clipping circuit includes a first switching element,
the first switching element is coupled to the input of the TIA,
the second clipping circuit includes a second switching element, and further includes a resistor coupled between the second switching element and the input of the TIA,
the clipping arrangement further includes a third clipping circuit, coupled to the input of the TIA,
the third clipping circuit includes a third switching element, and further includes a second resistor coupled between the third switching element and the input of the TIA, and
a resistance of the resistor is smaller than a resistance of the second resistor.

21. The TIA arrangement according to claim 1, wherein the bias voltage of the second clipping circuit is at least 100 millivolts (mV) higher than the bias voltage of the first clipping circuit.

22. The TIA arrangement according to claim 1, wherein the bias voltage of the second clipping circuit is higher than a voltage at the input of the TIA if an input current applied to the input of the TIA is equal to or greater than the maximum current for which the TIA is operable in a linear mode.

23. The TIA arrangement according to claim 1, wherein the impedance of the second clipping circuit is at least 50% larger than the impedance of the first clipping circuit.

24. The TIA arrangement according to claim 2, wherein:
the device is a photodetector to receive light and to convert the light to a current, and
the current is applied to the input of the TIA.

25. The TIA arrangement according to claim 11, wherein a resistance of the resistor is less than a resistance of a feedback resistor of the TIA.

26. An electronic component, comprising:
a transimpedance amplifier (TIA);
a first circuit; and
a second circuit,
wherein:
- the first circuit and the second circuit are coupled to an input of the TIA,
- an impedance of the second circuit is larger than an impedance of the first circuit,
- when the TIA is coupled to a device that is to sink current from the TIA, a bias voltage of the second circuit is higher than a bias voltage of the first circuit, and
- when the TIA is coupled to a device that is to source current to the TIA, a bias voltage of the second circuit is lower than a bias voltage of the first circuit.

27. The electronic component according to claim 26, wherein:
- the first circuit is to clamp an input voltage of the TIA when a current greater than a first current is applied to the input of the TIA, and
- the second circuit is to clamp the input voltage of the TIA when a current greater than a second current is applied to the input of the TIA, the first current being larger than the second current.

28. The electronic component according to claim 26, wherein:
- the TIA is to generate voltage pulses when input currents are applied to the input of the TIA, and
- the first circuit and the second circuit are to control width of the voltage pulses in different respective ranges of amplitude of the input currents, outside of a range of the input currents for which the TIA is operable in a linear mode.

29. The electronic component according to claim 26, wherein:
- the first circuit includes a first switching element,
- the first switching element is coupled to the input of the TIA,
- the second circuit includes a second switching element, and further includes a resistor coupled between the second switching element and the input of the TIA,
- the clipping arrangement further includes a third circuit, coupled to the input of the TIA,
- the third circuit includes a third switching element, and further includes a second resistor coupled between the third switching element and the input of the TIA, and
- a resistance of the resistor is smaller than a resistance of the second resistor.

30. The electronic component according to claim 26, wherein the electronic component is a receiver for a light detection and ranging (LIDAR) system.

31. The electronic component according to claim 26, further comprising a photodetector, wherein:
- the photodetector is to receive a light pulse and to generate a current pulse based on the received light pulse,
- the TIA is to convert a signal applied to an input of the TIA to a voltage pulse, and
- the signal applied to the input of the TIA is based on the current pulse generated by the photodetector.

32. The electronic component according to claim 31, wherein the electronic component is a receiver for a light detection and ranging (LIDAR) system.

* * * * *